(12) United States Patent
Yamamoto et al.

(10) Patent No.: US 8,647,755 B2
(45) Date of Patent: Feb. 11, 2014

(54) PERPENDICULAR MAGNETIC RECORDING MEDIUM AND MANUFACTURING METHOD THEREOF

(75) Inventors: Tomoo Yamamoto, Kanagawa (JP); Joe Inagaki, Kanagawa (JP); Takuya Kojima, Kanagawa (JP); Das Sarbanoo, Kanagawa (JP)

(73) Assignee: HGST Netherlands B. V., Amsterdam (NL)

( * ) Notice: Subject to any disclaimer, the term of this patent is extended or adjusted under 35 U.S.C. 154(b) by 1308 days.

(21) Appl. No.: 12/150,165

(22) Filed: Apr. 25, 2008

(65) Prior Publication Data

US 2008/0268289 A1   Oct. 30, 2008

(30) Foreign Application Priority Data

Apr. 26, 2007   (JP) .................................. 2007-117206

(51) Int. Cl.
*G11B 5/66* (2006.01)
(52) U.S. Cl.
USPC ........................................................ 428/829
(58) Field of Classification Search
USPC ................................................ 428/827–829
See application file for complete search history.

(56) References Cited

U.S. PATENT DOCUMENTS

| | | | | |
|---|---|---|---|---|
| 2002/0122960 | A1* | 9/2002 | Hanawa et al. | 428/694 TS |
| 2004/0185308 | A1* | 9/2004 | Koda et al. | 428/694 TS |
| 2006/0057431 | A1* | 3/2006 | Tamai et al. | 428/836.2 |
| 2006/0088737 | A1* | 4/2006 | Hirayama et al. | 428/836.2 |
| 2006/0204791 | A1  | 9/2006 | Sakawaki et al. | |

FOREIGN PATENT DOCUMENTS

| | | |
|---|---|---|
| JP | 2001-291230 | 10/2001 |
| JP | 2003-168207 A | 6/2003 |
| JP | 2004-022138 A | 1/2004 |
| JP | 2004-220737 A | 8/2004 |
| JP | 2005-093040 | 4/2005 |
| JP | 2005-190517 A | 7/2005 |
| JP | 2006-302426 A | 11/2005 |
| JP | 2006-079718 A | 3/2006 |
| JP | 2006-085742 | 3/2006 |

OTHER PUBLICATIONS

Japanese Office Action Summary from application No. 2007-117206 dated Jul. 12, 2011 (no translation).

* cited by examiner

*Primary Examiner* — Holly Rickman
*Assistant Examiner* — Linda Chau
(74) *Attorney, Agent, or Firm* — Zilka-Kotab, PC (57) ABSTRACT

Embodiments of the present invention provide a perpendicular magnetic recording medium with less medium noise, excellent overwrite characteristics, and scratch resistance. According to one embodiment, when an Ar gas with addition of a micro-amount of oxygen is used upon forming an upper Ru intermediate layer, a micro-structure of a magnetic layer formed thereon can be formed in a state where no magnetic oxide region is segregated and the magnetic crystal grains are isolated. In this case, a gas pressure for forming the upper intermediate layer is set to 5 Pa or more and 12 Pa or less which is a region much higher compared with 0.5 Pa or more and 1 Pa for the lower Ru intermediate layer. Since writing by a head becomes difficult remarkably in the perpendicular magnetic medium having magnetic crystal grains promoted for isolation, a second magnetic layer for facilitating magnetization reversal by lowering the oxide concentration and somewhat strengthening coupling between particles only in the magnetic layer on the side of the surface is formed to a layer above the first magnetic layer as a main part.

5 Claims, 10 Drawing Sheets

| Layer | Target composition |
|---|---|
| Upper magnetic layer 18 | Co-19at.%Cr-10at.%Pt-3at.%Mo |
| Lower magnetic layer 17 | (Co-17at.%Cr-18at.%Pt)-8mol.%SiO2 |
| Third intermediate layer 16b | Ru-O$_2$ |
| Second intermediate layer 16a | Ru |
| First intermediate layer 15 | Ni-8at.%W |
| Amorphous seed layer 14 | Cr-50at.%Ti |
| Upper soft magnetic backing layer 12b | Fe-34at.%Co-10at.%Ta-5at.%Zr |
| Anti-ferromagnetic coupling layer 13 | Ru |
| Lower soft magnetic backing layer 12a | Fe-34at.%Co-10at.%Ta-5at.%Zr |
| Adhesion layer 11 | Al-50at.%Ti |

| Layer | Target composition |
|---|---|
| Upper magnetic layer 18 | Co-19at.%Cr-10at.%Pt-3at.%Mo |
| Lower magnetic layer 17 | (Co-17at.%Cr-18at.%Pt)-8mol.%SiO2 |
| Third intermediate layer 16b | $Ru-O_2$ |
| Second intermediate layer 16a | Ru |
| First intermediate layer 15 | Ni-8at.%W |
| Amorphous seed layer 14 | Cr-50at.%Ti |
| Upper soft magnetic backing layer 12b | Fe-34at.%Co-10at.%Ta-5at.%Zr |
| Anti-ferromagnetic coupling layer 13 | Ru |
| Lower soft magnetic backing layer 12a | Fe-34at.%Co-10at.%Ta-5at.%Zr |
| Adhesion layer 11 | Al-50at.%Ti |

| Upper layer Ru pressure [Pa] | Reliability Scratch resistance |
|---|---|
| 5.0 | ○ |
| 6.0 | ○ |
| 7.0 | ○ |
| 8.0 | ○ |
| 9.0 | ○ |
| 10.0 | ○ |
| 11.0 | △ |
| 12.0 | △ |
| 12.5 | × |

Reliability Scratch resistance Evaluation standard
○ : No problem
△ : No problem in view of specification but resistance lowered
× : Problem in view of specification

BER specification value: -5.0 or less

|  |  | Lower layer Au  Ar gas pressure Pa | | | | |
|---|---|---|---|---|---|---|
|  |  | 0.5 | 1.0 | 1.5 | 2.0 | 5.0 |
| Upper layer Ru  Ar+O2 gas pressure Pa | 1.0 | -4.0 | -3.8 | -3.2 | -2.5 | -2.0 |
| | 2.0 | -4.3 | -4.0 | -3.5 | -2.9 | -2.2 |
| | 3.0 | -4.5 | -4.2 | -3.7 | -3.3 | -2.4 |
| | 4.0 | -4.9 | -4.7 | -4.1 | -3.6 | -2.6 |
| | 5.0 | -5.2 | -5.0 | -4.5 | -4.0 | -3.0 |
| | 6.0 | -5.2 | -5.0 | -4.5 | -4.2 | -3.2 |
| | 7.0 | -5.3 | -5.1 | -4.6 | -4.2 | -3.3 |
| | 8.0 | -5.3 | -5.2 | -4.5 | -4.3 | -3.5 |
| | 9.0 | -5.4 | -5.3 | -4.7 | -4.3 | -3.6 |
| | 10.0 | -5.5 | -5.4 | -4.8 | -4.5 | -3.7 |
| | 11.0 | -5.5 | -5.4 | -4.9 | -4.5 | -3.8 |
| | 12.0 | -5.6 | -5.4 | -4.9 | -4.6 | -4.0 |

Fig.11

BER specification value: -5.0 or less

Fig.12

| Hc [kA/m] | −Hn [kA/m] | Hs [kA/m] |
|---|---|---|
| 366 | 191 | 605 |

PERPENDICULAR MAGNETIC RECORDING MEDIUM AND MANUFACTURING METHOD THEREOF

CROSS-REFERENCE TO RELATED APPLICATION

The instant nonprovisional patent application claims priority to Japanese Patent Application No. 2007-117206 filed Apr. 26, 2007 and which is incorporated by reference in its entirety herein for all purposes.

BACKGROUND OF THE INVENTION

Since the internet has been popularized in recent years, demand for magnetic disk drives has increased along with the increase of shipments of personal computers. While connection can be made to the internet not only from personal computers but also from mobile terminals, it is preferred to incorporate a magnetic disk drive for handling a large capacity of information in order to attain a further convenience in the mobile terminal. Further, along with digitalization of television broadcasting, a trend of using magnetic disk drive as a video recording device is increasing. As described above, the field of application of the magnetic disk drive has been extended more and more, and decrease in the size and increase in the capacity have been demanded from users.

A longitudinal recording system has been adopted in existent magnetic disk drives. In longitudinal recording, the direction of magnetization to be recorded is in plane and adjacent magnetization is in an opposite polarity. Accordingly, a magnetization transition region is formed between adjacent recording bits for decreasing a static magnetic energy. A large width of the magnetization transition region causes an increase of the noise. In order to decrease the same, it is considered that reduction of the thickness of the magnetic film and refinement of the magnetic crystal grain size are effective. Accordingly, approaches to higher recording densities of a longitudinal recording media have mainly been directed to decreasing the volume of a micro-magnet constituting a recording bit. However, it is considered that further higher recording density in the future cannot be coped easily with the longitudinal recording medium owing to a physical limit. That is, the longitudinal recording medium causes a problem for the basic function of preserving recorded information due to thermal fluctuation phenomenon of magnetization along with refinement of the micro-magnet constituting the recording bit.

Therefore, perpendicular magnetic recording media have been developed mainly in recent years. In the perpendicular recording, since the direction of the recording magnetization is perpendicular to the film surface and no strong charge is present between adjacent recording bits, the width of the magnetization transition region does not increase as much as in the longitudinal medium. On the other hand, the perpendicular recording has a characteristic that the anti-magnetic field exerting between adjacent bits decreases as the recording density increases to keep the recording magnetization stable. Further, since a strong head magnetic field is obtained by providing a soft magnetic backing layer having a high permeability below the perpendicular recording layer, the coercivity of the perpendicular recording layer can be increased and this is one of the promising approaches for overcoming the limit of thermal demagnetization in the longitudinal recording system. Accordingly, a further increase in the density of a magnetic disk drives (HDD) is possible and application to HDD products has already been started in some fields.

A medium used in the perpendicular recording system mainly comprises a soft magnetic backing layer that assists a recording head, and a vertical magnetic recording layer for recording and possessing magnetic information. It is desirable to use, as the perpendicular magnetic recording layer, those materials having a strong perpendicular magnetic anisotropy such that the recording magnetization is arranged in a direction perpendicular to a film surface and in which each of magnetic particles is isolated magnetically for reducing noises. Specifically, granular type materials comprising a Co—Cr—Pt type alloy with addition of an oxide such as $SiO_2$ have been studied generally. In the granular type perpendicular recording layer, since non-magnetic oxides form a grain boundary so as to surround the magnetic particle, magnetic interaction between adjacent magnetic particles is decreased. Further, since the grain boundary of the oxide suppresses the coupling between the magnetic particles, this has a feature capable of decreasing the dispersion of the particle size compared with existent Cr segregation type longitudinal recording media. The perpendicular magnetic recording medium having such a fine structure has low noise property and excellent heat stability together, for which a great expectation has been placed in the improvement of the recording density.

However, when the magnetic interaction between adjacent magnetic particles greatly decreases, each of the magnetic particles strongly tends to reverse independently to increase the dispersion of a reversed magnetic field. On the other hand, for the recording head, a study has been progressed for a head with a trailing shield in order to improve the magnetic field gradient and improve the recording resolution power. In the recording head of this type, the recording magnetic field intensity tends to lower compared with existent monopole type heads. In such a situation, improvement in the information writing performance has been demanded while ensuring low noise and excellent heat stability for the perpendicular magnetic recording medium.

For the demand for the perpendicular magnetic recording medium as described above, Japanese Patent Application No. 2004-310910 ("Patent Document 1"), for instance, proposes a medium having two or more magnetic layers for a perpendicular recording layer, at least one layer being a layer comprising Co as a main ingredient, containing Pt, and containing an oxide, and at least one the other layer being a layer comprising Co as a main ingredient, containing Cr, and not containing an oxide. With such a layer constitution of the perpendicular recording layer, refinement and magnetic isolation of magnetic particles are promoted and signal/noise ratio upon reading can be improved greatly. Further, it is described that also the thermal fluctuation resistance can be improved by improving the reverse magnetic domain nuclei forming magnetic field (—Hn) and a medium having a further excellent recording characteristic can be obtained.

Further, Japanese Patent Publication No. 2006-302426 ("Patent Document 2") discloses a granular perpendicular recording layer comprising a Co—Cr—Pt type alloy with addition of an oxide such as $SiO_2$ in which the oxygen concentration on the side of the boundary with an intermediate layer is increased to higher than that on the side of the surface. The intermediate layer is a layer disposed below the perpendicular recording layer and responsible to the crystal orientation property of a perpendicular recording layer and formation of a model for the granular structure. The main point of the technique is that the degree of segregation of the oxide is different depending on the growing stage of magnetic crystal grains and segregation is promoted by increasing the oxygen concentration since segregation is more difficult in the initial stage of growing than that during growing. That is, it proposes to change the oxygen concentration contained in the magnetic layer in the direction of the film thickness.

Japanese Patent Publication No. 2004-22138 ("Patent Document 3") discloses two techniques. The first technique controls a gas pressure stepwise upon forming an intermediate layer in which a portion for the initial layer is formed at a low gas pressure and a surface portion is formed at a high gas pressure. It is described that the crystallinity and orientation property are ensured in the initial layer by a dense structure, the surface layer forms a more coarse structure than the initial layer, and a structure of a large crystal grain boundary width is formed so as to absorb gas molecules easily. In the second technique, an intermediate layer is formed in an atmosphere with addition of a micro-amount oxygen or nitrogen to a rare gas. Alternatively, the surface is exposed to a gas formed by adding a micro-amount of oxygen or nitrogen to the rare gas. It is described that this can segregate oxygen or nitrogen in the crystal grain boundary of the intermediate layer to form a formation site of a non-magnetic non-metal as a crystal grain boundary for the perpendicular recording layer formed thereon. However, when the intermediate layer is divided at least into two regions, oxygen is not added to a portion of the initial layer and oxygen is added to a portion of the surface layer, referring to the respective gas pressures, it is 10 mTorr (1.3 Pa) for the portion of the surface layer relative to 30 mTorr (4.0 Pa) for the portion of the initial stage layer, and the portion of the surface layer is formed at a low gas pressure (see Patent Document 3, FIG. 5).

In the increase of the density of the perpendicular magnetic recording medium, refinement and magnetic isolation of magnetic crystal grains are important subjects as also described for the prior art. For this purpose, it is important to prepare a model on the surface of the intermediate layer so as to promote the growing of the magnetic layer that separates into a segregation phase comprising magnetic crystal grains and the oxide. Since the crystal orientation property of the magnetic crystal grains is also controlled simultaneously in the intermediate layer, it is not allowed that the crystallinity is worsened for the formation of the model.

When isolation of the magnetic crystal grains is promoted, since the respective magnetic crystal grains behave independently to the recording magnetic field, reversal of the polarity by the magnetic head becomes difficult to remarkably lower the ease of writing. Accordingly, when the isolation of the magnetic crystal grains is promoted, the effect cannot be obtained to the utmost degree unless the writing performance is improved at the same time. Further, since it may be a worry that the scratch resistance is weakened as the magnetic crystal grains are isolated, ensuring the reliability is important for isolation. It is necessary to attempt compatibilization while finding the limit thereof.

BRIEF SUMMARY OF THE INVENTION

An object of embodiments of the present invention is to provide a perpendicular magnetic recording medium with less medium noise, excellent overwrite characteristics, and scratch resistance. According to the particular embodiment of FIG. 1, when an Ar gas with addition of a micro-amount of oxygen is used upon forming an upper Ru intermediate layer 16b, a micro-structure of a magnetic layer 17 formed thereon can be formed in a state where no magnetic oxide region is segregated and the magnetic crystal grains are isolated. In this case, a gas pressure for forming the upper intermediate layer 16b is set to 5 Pa or more and 12 Pa or less which is a region much higher compared with 0.5 Pa or more and 1 Pa for the lower Ru intermediate layer 16a. Since writing by a head becomes difficult remarkably in the perpendicular magnetic medium having magnetic crystal grains promoted for isolation, a second magnetic layer 18 for facilitating magnetization reversal by lowering the oxide concentration and somewhat strengthening coupling between particles only in the magnetic layer on the side of the surface is formed to a layer above the first magnetic layer 17 as a main part.

DETAILED DESCRIPTION OF THE INVENTION

Embodiments of the present invention relate to a perpendicular magnetic recording medium capable of recoding a great amount of information and a manufacturing method thereof.

An object of embodiments of the present invention is to provide a perpendicular magnetic recording medium with less medium noise, excellent overwrite characteristics, and scratch resistance.

For solving the subject described above, embodiments of the present invention provide a perpendicular magnetic recording medium comprising at least: a substrate; a soft magnetic layer formed on the substrate; a second intermediate layer formed above the soft magnetic layer and containing Ru; a third intermediate layer formed on the second intermediate layer and comprising Ru, an inevitable element, and oxygen; a first magnetic recording layer formed on the third intermediate layer and having a crystal grain boundary comprising crystal grains and an oxide; and a second magnetic recording layer formed on the first magnetic recording layer, the concentration of the oxide of the second magnetic recording layer being lower compared with that of the first magnetic recording layer; wherein the crystal grains of the first magnetic recording layer are epitaxially grown on the Ru crystal grains of the second intermediate layer.

Further, the method of manufacturing the perpendicular magnetic recording medium has a feature of forming a sputter target comprising Ru and inevitable elements by a sputtering method of introducing an oxygen-added Ar gas upon forming a third intermediate layer formed on the second intermediate layer and comprising Ru, inevitable element, and oxygen. Further, it is preferred that an Ar gas pressure upon forming the second intermediate layer is 0.5 Pa or more up to 1 Pa and an oxygen concentration in the oxygen-added Ar gas introduced is 0.05% or more and 0.5% or less, and the gas pressure is 5 Pa or more and 12 Pa or less upon forming the third intermediate layer.

According to embodiments of the invention, it is possible to decrease the medium noise, improve the writing performance, and ensure the scratch resistance of the perpendicular magnetic recording medium.

An object of embodiments of the invention is to use an Ar gas with addition of a micro-amount of oxygen upon forming the third intermediate layer (upper layer Ru), whereby a micro structure of the magnetic layer formed thereon forms a state in which a non-magnetic oxide region is segregated and magnetic crystal grains are isolated. The gas pressure for forming the third intermediate layer in this case is set to a region of 5 Pa or more and 12 Pa or less, which is much higher compared with 0.5 Pa or more up to 1 Pa for the second intermediate layer (lower layer Ru). Since writing by the head is remarkably difficult for the perpendicular magnetic recording medium having the magnetic crystal grains promoted for isolation, the writing performance can be improved by using a second magnetic layer in which the oxygen concentration is lowered for facilitating the magnetization reversal by somewhat strengthening the coupling between the particles in the perpendicular magnetic recording medium only on the side of the surface of the upper layer of the first magnetic layer as a main component.

By the effect of improving the easy writing of the magnetic layer, the effect of adding oxygen to the third intermediate layer (upper layer Ru) is provided to the maximum. In Patent Document 3, when oxygen is added to the upper layer Ru, the pressure is suppressed lower than that of the lower layer Ru. This is considered that the writing performance as a medium is remarkably worsened in a state where the isolation is promoted excessively. According to embodiments of the invention, it could be confirmed experimentally that preferred BER (Bit Error Rate) can be obtained by increasing the pressure for the upper layer Ru also when oxygen is added to the upper layer Ru. This is considered to be an effect that the writing performance is improved greatly by forming the magnetic layer as dual layer. The reason why it is better to lower the pressure for the lower layer Ru as much as possible as 0.5 Pa or more and up to 1 Pa in a dischargeable range is that the crystal orientation property is deteriorated upon the thin film formation in a high pressure gas, which worsens the perpendicular orientation property of the magnetic layer.

Patent Documents 2 and 3 disclose that the isolation of the magnetic crystal grains is promoted by increasing the oxygen concentration at the boundary between the intermediate layer and the magnetic layer. As the method, exposing the surface to oxygen before forming the magnetic film or adding oxygen only at the initial stage of growing the magnetic film has been proposed. On the contrary, in embodiments of this invention, oxygen is added to the upper intermediate layer per se adjacent to the magnetic layer. This can directly intake oxygen and, naturally, an oxygen excessive region can be present also on the surface.

Figure 1:
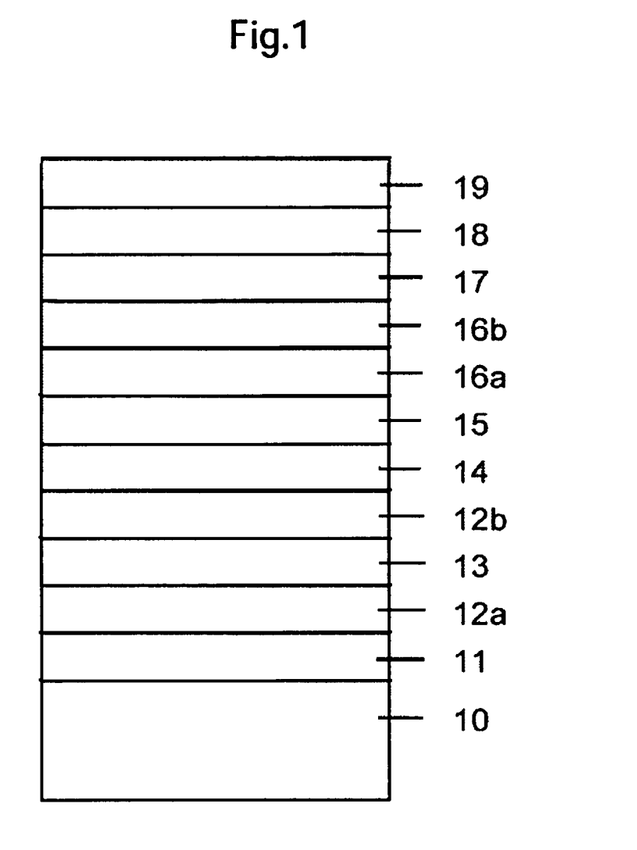
FIG. 1 is a cross sectional view of a perpendicular magnetic recording medium according to an example of an embodiment of the present invention.
Figure 2:
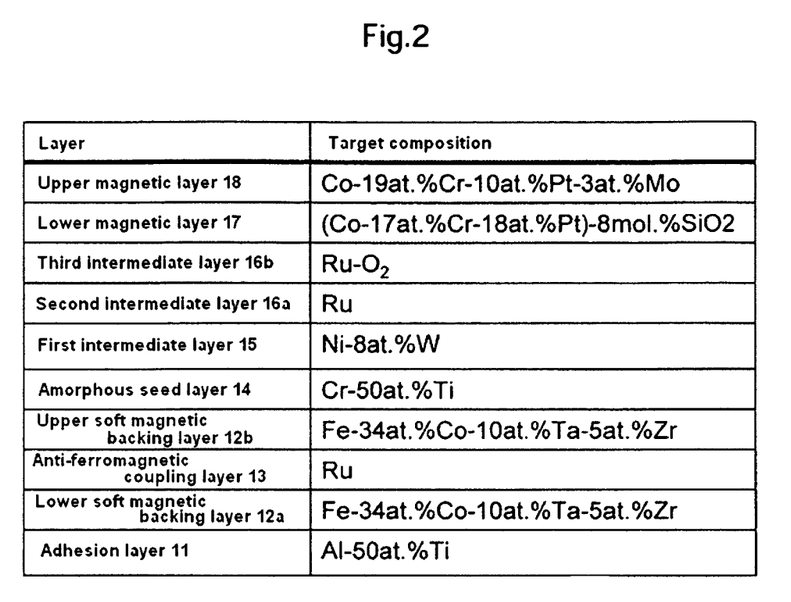
FIG. 2 is a view showing a target composition used upon manufacture of the perpendicular magnetic medium of FIG. 1.

A perpendicular magnetic recording medium and a manufacturing method thereof according to an example of this invention are to be described specifically with reference to the drawings. FIG. 1 is a cross sectional view of a perpendicular magnetic recording medium. FIG. 2 collectively shows as a table a composition of a sputtering target used for forming each of the layers. The basic layer constitution of the perpendicular magnetic recording medium in this example is as described below. A sputtering apparatus (C-3040) manufactured by Canon Anelba Corporation was used for forming each of the layers. An adhesion layer 11 comprising Al-50 at. % Ti is formed to 5 nm on a glass substrate 10. Then, an under layer soft magnetic backing layer 12a comprising Fe-34 at. % Co-10 at. % Ta-5 at. % Zr is formed to 30 nm, an anti-ferromagnetic coupling layer 13 comprising Ru is formed to 0.4 nm, and an upper soft magnetic backing layer 12b comprising Fe-34 at. % Co-10 at. % Ta-5 at. % Zr is formed to 30 nm. An amorphous seed layer 14 comprising Cr-50 at. % Ti is formed to 2 nm for offsetting the crystal arrangement of the soft magnetic backing layer. Further thereover, are formed a first intermediate layer 15 comprising Ni-8 at. % W for controlling the crystal structure of the second intermediate layer 16a to 7 nm, a second intermediate layer 16a comprising Ru to 9 nm, and a third intermediate layer 16b comprising Ru to 8 nm to form an intermediate layer comprising three layers in total. Above the intermediate layer, are formed (Co-17 at. % Cr-18 at. % Pt)–8 mol % $SiO_2$ to 13 nm as the under layer magnetic layer (first magnetic recording layer) 17, and Co-19 at. % Cr-10 at. % Pt-3 at. % Mo to 7 nm as the upper magnetic layer (second magnetic recording layer) 18. Finally, a carbon layer is formed to 4 nm as a protection lubrication layer 19 and a perfluoro alkyl polyether type material is coated further thereon.

One of differences between the second intermediate layer 16a comprising Ru (lower layer Ru) and the third intermediate layer 16b (upper layer Ru) comprising Ru is a sputtering pressure upon formation. Ru for the second intermediate layer is formed at a low pressure of 1 Pa or less and Ru for the third intermediate layer is formed at high pressure of 5 Pa or more, respectively. It is particularly preferred for a range of 0.5 Pa or more and 1 Pa or less for Ru of the second intermediate layer and 5 Pa or more and 12 Pa or less for Ru of the third intermediate layer. Another difference is a presence or absence of oxygen addition to the sputtering gas. While pure Ar is used as the sputtering gas for Ru of the second intermediate layer 16a, Ar with addition of an oxygen gas is used for Ru of the third intermediate layer. The first intermediate layer 15 is used for preventing disturbance of the crystal structure of the second intermediate layer 16a formed thereon and for epitaxially growing the first magnetic recording layer 17 on the third intermediate layer 16b.

FIG. 3 to FIG. 6 show the change of the magnetic property and the RW property upon adding oxygen to Ru of the third intermediate layer 16b. The amount of oxygen adding to the third intermediate layer 16b was changed by the following method. Two systems of gas pipelines were provided in a sputtering chamber for forming the third intermediate layer. A pure Ar gas reservoir is connected to the first system of the pipelines and the flow rate was controlled by a first control valve. An Ar+10% $O_2$ gas reservoir is connected to the second system of the pipelines and the flow rate was controlled by a second control valve. When the total gas flow rate is made constant, the pressure in the chamber is also constant. Accordingly, when the oxygen concentration is changed, the flow rate ratio was controlled while keeping the entire gas flow rate constant. Further, also for the pressure, three types, that is, 5, 6, and 7 Pa were investigated while changing the entire gas flow rate.

Figure 3:
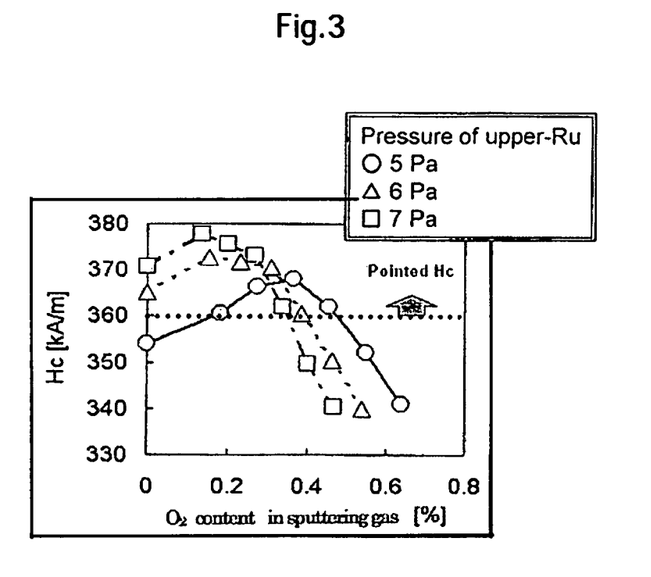
FIG. 3 is a view showing a relation between the oxygen addition amount to a sputtering gas upon forming an upper layer Ru and Hc.
Figure 4:
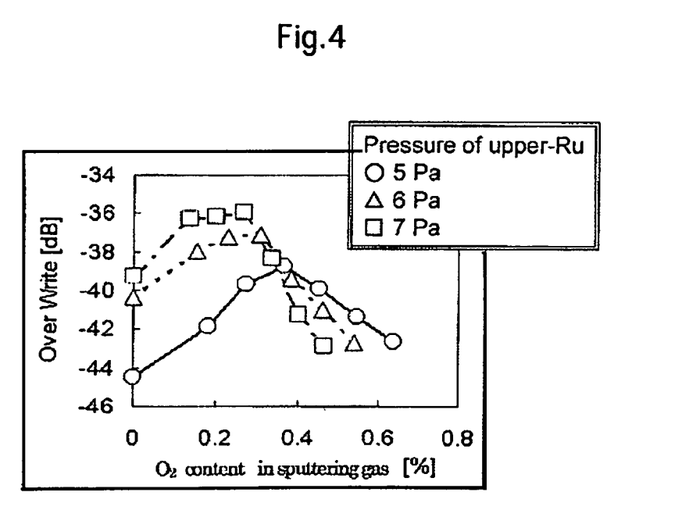
FIG. 4 is a view showing a relation between the oxygen addition amount to a sputtering gas upon forming an upper layer Ru and overwriting.

FIG. 3 is a result for examining the oxygen dependence of coercivity (Hc). The abscissa shows the content rate of oxygen ($O_2$) in the sputtering gas forming the third intermediate layer (upper layer Ru) 16b, and the ordinate shows the coercivity (Hc) of the magnetic recording layer. As the total pressure is higher, Hc is higher, the change relative to the oxygen concentration is abrupt, and the peak position shifts to the lower side of the oxygen concentration. FIG. 4 shows the overwrite property and this changes like the coercivity in FIG. 3. The overwrite means that writing is easier toward the lower side of the graph, that is, as the numerical value increases to the negative side. The graph suggests that writing is more difficult as Hc is higher.

Figure 5:
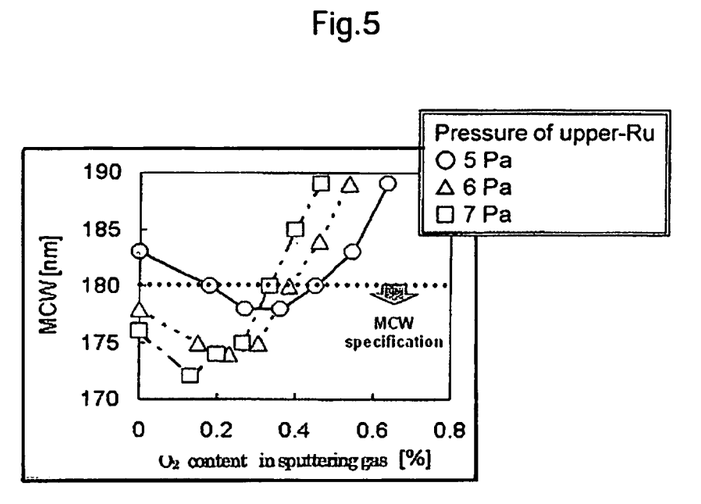
FIG. 5 is a view showing a relation between the oxygen addition amount to a sputtering gas upon forming an upper layer Ru and MCW.
Figure 6:
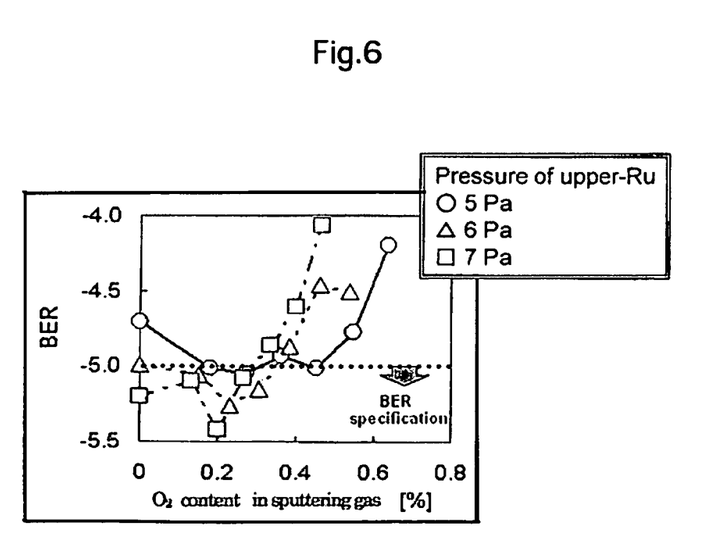
FIG. 6 is a view showing a relation between the oxygen addition amount to a sputtering gas upon forming an upper layer Ru and bit error rate (BER).

FIG. 5 is a graph showing the change of MCW. MCW is a track width upon recording a signal, and writing to the track less extends as the width is narrower, which is suitable to high density recording. MCW changes opposite to the change of Hc or overwrite. There is an oxygen addition amount providing the narrowest track at each of the pressures, and the optimal addition amount shifts to the lower oxygen side as the pressure is higher. As the total pressure is higher, track is narrowed. FIG. 6 is a graph showing the change of BER (Bit Error Rate). Since BER represents a coefficient when the information error rate is converted into logarithm, the error rate is lower and the performance of medium is higher as the value increases to the negative side. The graph for BER changes in the same manner as in MCW in FIG. 5. BER is most preferred at high gas pressure and when a micro-amount of oxygen is added.

When the results described above are summarized, it has been found that the first intermediate layer 15 and the second intermediate layer 16a form a film of a consistent crystal structure, and BER is improved as the MCW is narrowed by adding a micro-amount of oxygen of 0.1 to 0.5% to a sputtering gas upon forming Ru of the third intermediate layer 16b thereon. Further, it has been found that MCW is narrower and BER is improved as the gas pressure is higher upon forming the third intermediate layer. The lower limit pressure is substantially determined by the RW specification of: MCW<180 nm and BER<−5.0, and the lower limit is at 5 Pa, that is studied in this case. On the other hand, for the upper limit pressure, the RW property is further improved along with increase in the pressure, and the upper limit cannot be defined in view of the RW property in a range up to 12.5 Pa.

For evaluating the scratch resistance, a scratch damage test applying a ramp load system was conducted. The scratch damage test is a test of colliding a magnetic head for several times to a magnetic recording medium during rotation by a ramp load to give scratch-like damages to the medium. In this test, since damage to the magnetic recording medium is added under acceleration, the ramp load speed was set to 20 times of the speed in the actual magnetic disk apparatus. An HDI Reliability Tester manufactured by CENTER FOR TRIBOLOGY in USA was used. The HDI Reliability Tester is provided with an actuator for holding a magnetic recording medium and moving the magnetic head in an arcuate shape and a ramp (sliding bed) to the outside of the outer end of the magnetic recording medium. The HDI Reliability Tester has a control function of the magnetic head which sweeps under interlocking between the ramp and the magnetic recording medium. The ramp load is, for example, "load/unload mechanism" described in "Modern Storage Terminology Dictionary", page 293, published by Nikkei BP Co.

Figure 7:
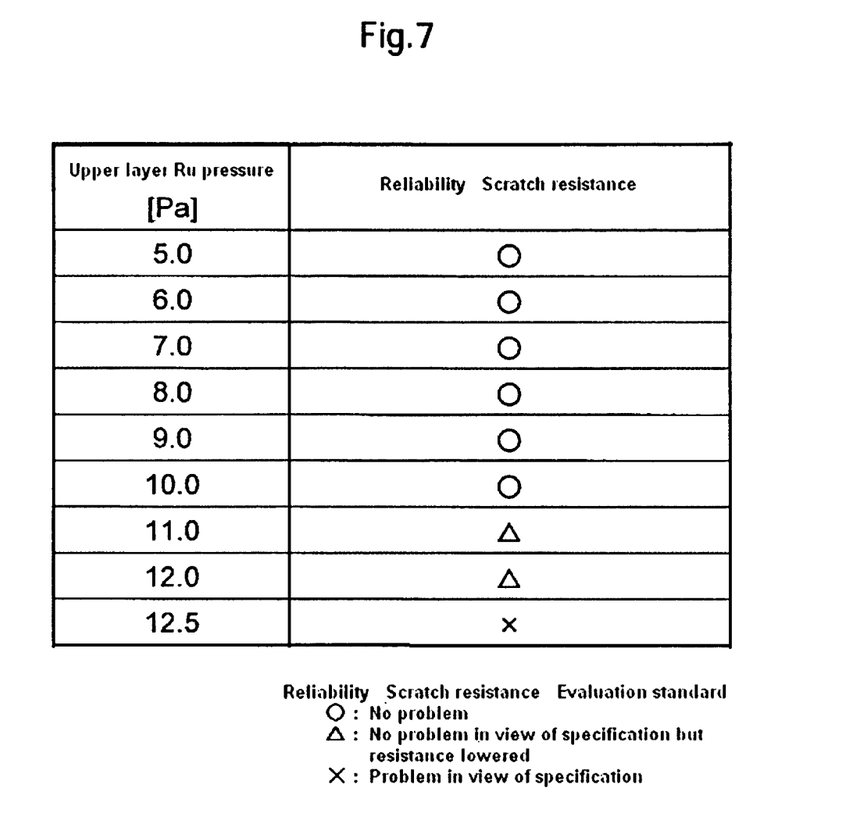
FIG. 7 is a view showing a relation between the oxygen addition amount to a sputtering gas upon forming an upper layer Ru and scratch resistance.

After the scratch damage test, scratch damages on the surface of the magnetic recording medium were detected and the number of damages was counted and analyzed. In the scratch damaged portion, the protective film on the magnetic recording medium was decreased in the thickness or erased, which was imaged by an ellipsometric method by a laser to calculate the number of damages by image processing. For the counting and analysis of the scratch damages, Candela Optical Surface Analyzer (Model 6120) manufactured by KLATENCOR Co. was used. In FIG. 7, evaluation was made as a circular symbol for those with the number of damages of the 30 or less, as a trigonal symbol for those with the number of damages from 30 to 50 and as a X symbol for those with the number of damages exceeding 50. The number of 50 or less is within a range of the specification.

As a result of the evaluation for the scratch resistance, as shown in FIG. 7, it has been found that the reliability strength weakens gradually in a high gas pressure region exceeding 10 Pa, and the scratch resistance is out of the specification at 12.5 Pa to result in a practical problem. It is defined as 12 Pa or less with a view point of the reliability strength. The optimal oxygen concentration was 0.05% when defined at 12 Pa. Summarizing the above, it is preferred for satisfying the RW property and the reliability simultaneously to define the oxygen addition amount to the sputtering gas is 0.05% or more and 0.5% or less and the gas pressure is 5 Pa or more and 12 Pa or less upon forming Ru for the third intermediate layer.

Figure 8:
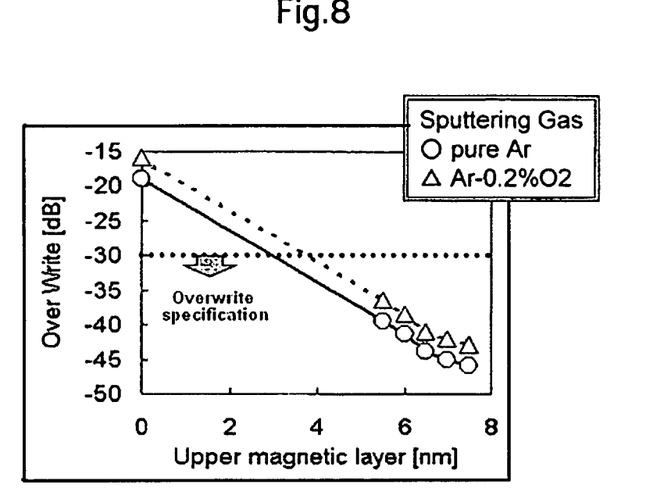
FIG. 8 is a view showing a relation between the film thickness of an upper magnetic layer and overwriting.
Figure 9:
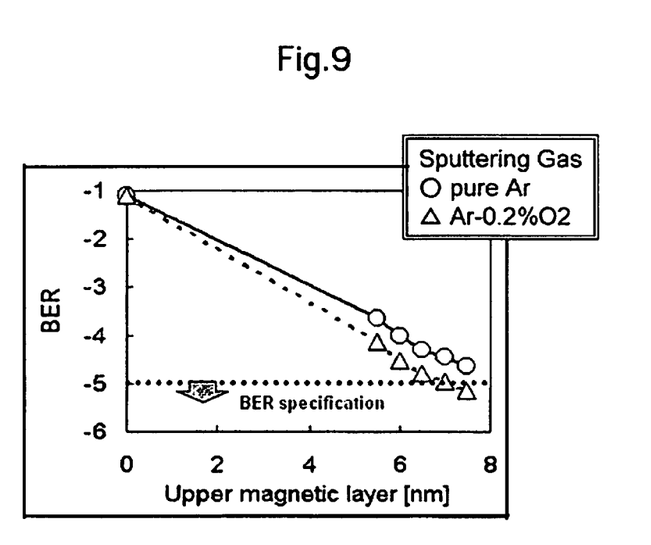
FIG. 9 is a view showing a relation between the film thickness of an upper magnetic layer and BER.

In the perpendicular magnetic recording medium of the above example, investigation of changing the film thickness of the upper magnetic layer 18 was conducted while setting the gas pressure in common at 8 Pa upon forming Ru of the third intermediate layer 16b while comparing the conditions between with addition of 0.1% oxygen and with no oxygen addition. The upper magnetic layer 18 is used with an aim of strengthening the coupling between the magnetic crystal grains to improve the easiness for writing by the magnetic head. Generally, easiness for writing of the medium is evaluated based on the overwriting property. FIG. 8 shows the dependence of the upper magnetic layer on the film thickness for the overwriting property and the overwrite property is improved substantially linearly by the increase of the thickness of the upper magnetic layer. In a case with no upper magnetic layer, it is supposed that satisfaction for the specification of −30 dB or less is rather difficult even by using any other means. As shown in FIG. 9, BER in this case (with no upper magnetic layer), circular symbols and trigonal symbols are superimposed and the effect of adding the micro-amount of oxygen to the third intermediate layer 16b as obtained in Example 1 is not observed. This means that the effect described above cannot be observed when the overwrite is excessively poor and no sufficient signal writing can be conducted. In a region where the upper magnetic layer of at least 4 nm or more is disposed to improve the writing performance, the effect of adding the micro-amount of oxygen to Ru of the third intermediate layer is observed.

Figure 10:
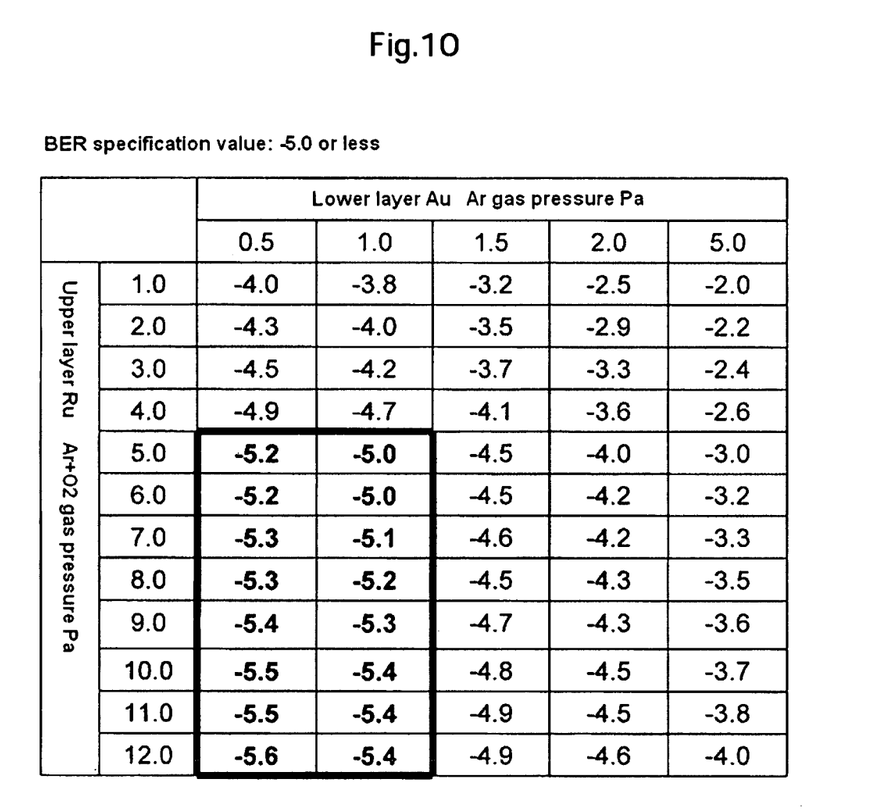
FIG. 10 is a view showing a relation between a gas pressure upon forming a lower layer Ru and an upper layer Ru and BER.

In the perpendicular magnetic recording medium of the example as described above, the gas pressure upon forming the second intermediate layer (lower layer Ru) 16a and the third intermediate layer (upper layer Ru) was investigated. A pure Ar gas was used for the second intermediate layer 16a which was changed in a range from 0.5 to 5.0 Pa. For the third intermediate layer 16b, an Ar+O₂ gas with addition of 0.2% oxygen to an Ar gas was used and it was changed in a range from 1.0 to 12.0 Pa. The manufactured media were put to RW evaluation and FIG. 10 shows the result of measurement for BER. In a region where the gas pressure for the under layer Ru exceeds 1.0 Pa, the BER specification (−5.0 or less) is not satisfied. While it was intended to investigate also for 0.4 Pa where the gas pressure for the lower layer Ru was further lowered, since generation of arc was recognized in the sputtering discharge waveform and this was not preferred with a view point of production stability, the lower limit was defined as 0.5 Pa. On the other hand, for the gas pressure for the upper layer Ru, the BER specification is not satisfied in a region below 5.0 Pa. For the upper limit, it is 12 Pa with a view point of the reliability as shown by the result in Example 1.

From the foregoing results, the range for the gas pressure for the second intermediate layer (lower layer Ru) 16a is defined as 0.5 Pa or more and 1.0 Pa or less. Also when an Ar gas with addition of oxygen is used for the formation of the third intermediate layer (upper layer Ru) 16b, it was found that the range for the gas pressure for the second intermediate layer (lower layer Ru) 16a could provide a good RW property in a range of a lower gas pressure compared with a gas pressure range (5 Pa or more and 12 Pa or less) for the third intermediate layer (upper layer Ru) 16b.

Figure 11:
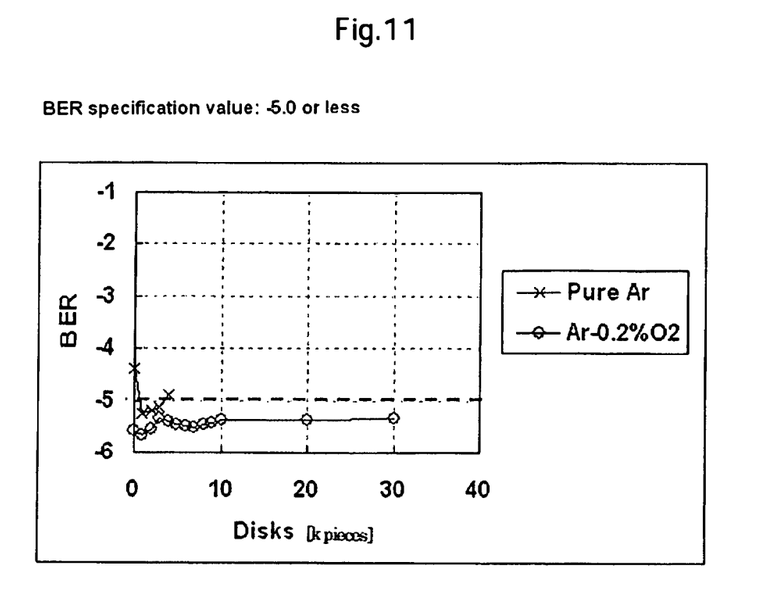
FIG. 11 is a view showing a relation between accumulated numbers of media manufactured continuously, and BER.
Figure 12:
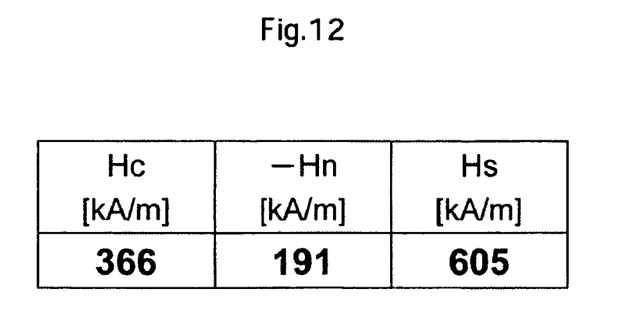
FIG. 12 is a view showing a central value for the magnetic property of media manufactured continuously by 30,000 sheets with addition of oxygen to Ru.
Figure 13:
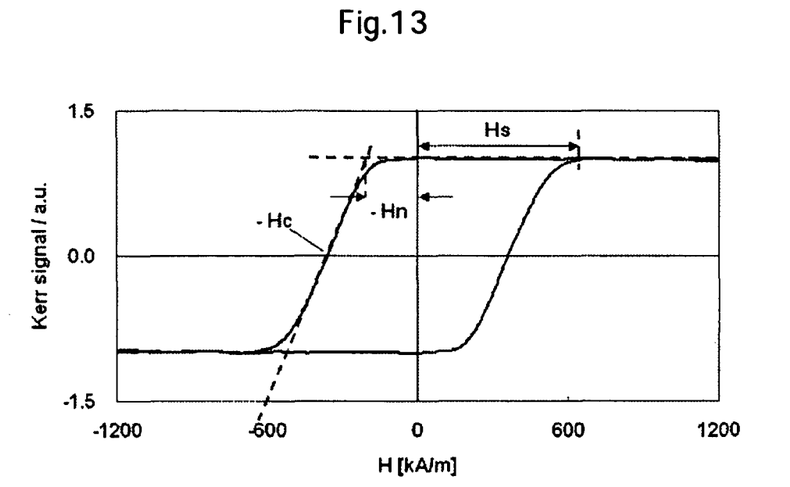
FIG. 13 is a view showing a hysteresis loop by a magnetic property evaluation apparatus utilizing a Kerr effect.

In the perpendicular magnetic recording medium of the example, 30,000 sheets of magnetic recording media were manufactured while the oxygen concentration to be added upon forming Ru of the third intermediate layer 16b to 0.2% is controlled. The manufactured media were put to RW evaluation and FIG. 11 shows the result of measurement for BER. The perpendicular recording magnetic head was used for RW evaluation and the maximum recording density was measured at 1000 kfci. When the oxygen is not added upon Ru formation, BER is not stabilized and the specification (−5.0 or less) is not satisfied. On the other hand, when oxygen is added, it has been found that a stable high performance BER can be attained to satisfy the specification as shown in FIG. 11. FIG. 12 shows typical magnetic properties of the magnetic recording media used for evaluation. The definition for the magnetic property is a value for a portion of a hysteresis loop measured according to Kerr effect shown in FIG. 13.

Figure 14:
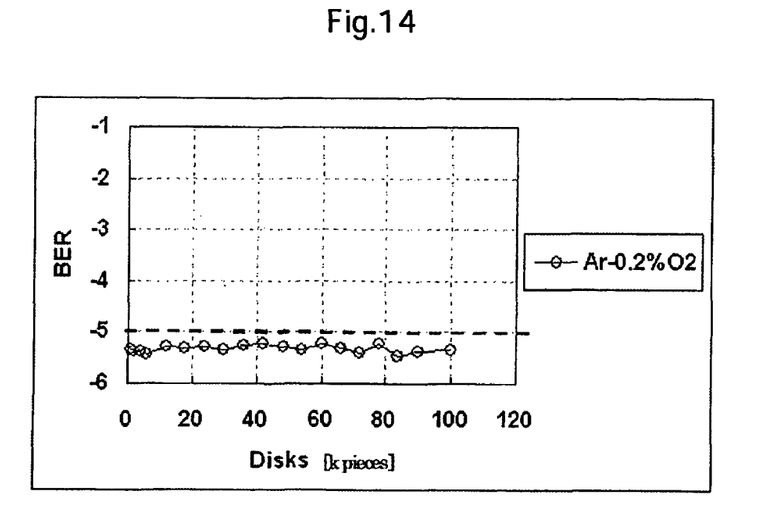
FIG. 14 is a view showing a relation between the accumulated numbers of continuously manufactured media and BER.

The magnetic recording media were produced in the same manner as described above except for producing the number of continuous production for 100,000 sheets and they were put to RW evaluation. FIG. 14 shows the result of evaluation. It has been found that BER was stable even at 100,000 sheets to satisfy the specification.

Figure 15:
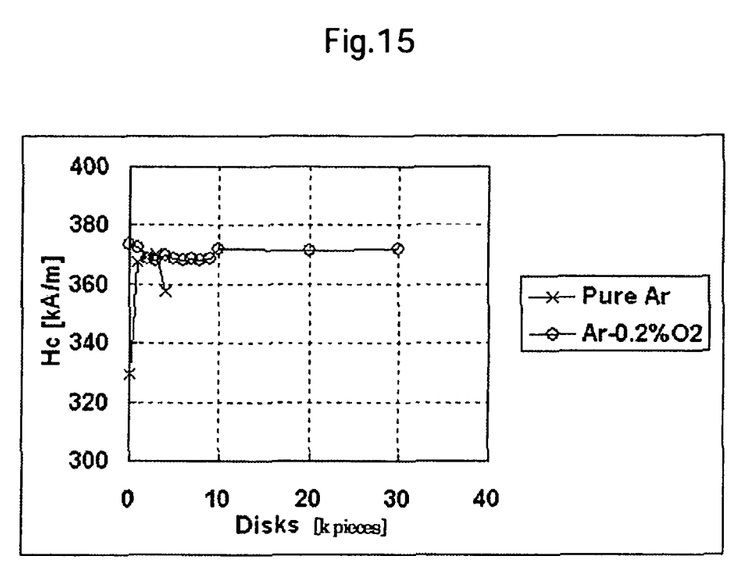
FIG. 15 is a view showing a relation between the accumulated numbers of continuously manufactured media and Hc.

Then, for a comparative example, a magnetic recording medium was manufactured without controlling the oxygen concentration to be added upon forming Ru of the third intermediate layer 16b in the perpendicular magnetic recording medium of the example. As a result, no stable high performance BER could be attained as shown by the example of pure Ar in FIG. 11. FIG. 15 shows typical magnetic properties of the magnetic recording medium used for evaluation. When oxygen is added under control, the dependence of the magnetic property on the number of produced sheets decreases. It is considered that the stability contributes to the stabilization of BER.

What is claimed is:

1. A perpendicular magnetic recording medium comprising:
    a substrate;
    a soft magnetic layer formed above the substrate;
    a second intermediate layer formed above the soft magnetic layer and containing Ru;
    a third intermediate layer formed on the second intermediate layer, including Ru as a main ingredient, and containing oxygen;
    a first magnetic recording layer formed on the third intermediate layer and having crystal grains with a boundary and an oxide; and
    a second magnetic recording layer formed on the first magnetic recording layer with the concentration of an oxide being lower compared with that of the first magnetic recording layer,
    wherein the crystal grains of the first magnetic recording layer are epitaxially grown above Ru crystal grains of the third intermediate layer, and
    wherein a first intermediate layer for controlling the crystal structure of the second intermediate layer is provided between the soft magnetic layer and the second intermediate layer.

2. The perpendicular magnetic recording medium according to claim 1, wherein the first magnetic recording layer includes Co as a main ingredient and containing $SiO_2$, and the second magnetic recording layer includes Co as a main ingredient and has a film thickness of 4 nm or more.

3. The perpendicular magnetic recording medium according to claim 1, wherein the first intermediate layer contains Ni—W.

4. The perpendicular magnetic recording medium according to claim 1, wherein an amorphous seed layer is provided between the soft magnetic layer and the first intermediate layer.

5. The perpendicular magnetic recording medium according to claim 4, wherein the amorphous seed layer contains Cr—Ti.

* * * * *